United States Patent [19]

Nesbitt

[11] Patent Number: 4,526,810
[45] Date of Patent: Jul. 2, 1985

[54] PROCESS FOR IMPROVED WALL DEFINITION OF AN ADDITIVE PRINTED CIRCUIT

[75] Inventor: Raymond A. Nesbitt, Henrico County, Va.

[73] Assignee: AT&T Technologies, Inc., New York, N.Y.

[21] Appl. No.: 373,194

[22] Filed: Jun. 17, 1982

[51] Int. Cl.³ .......................... B05D 3/10; B05D 5/12
[52] U.S. Cl. .................................... 427/98; 204/15; 204/38.4; 427/259; 427/307; 430/271; 430/273; 430/311; 430/315
[58] Field of Search ................... 427/98, 259, 307; 430/314, 315, 271, 273, 311; 204/15, 38.4

[56] References Cited

U.S. PATENT DOCUMENTS

| | | | |
|---|---|---|---|
| T825,262 | 11/1969 | Yackel | 294/138 |
| 2,279,567 | 4/1942 | Holman | 204/15 |
| 3,773,514 | 11/1973 | Fromson | 430/17 |
| 4,002,478 | 1/1977 | Kokawa et al. | 430/258 |
| 4,115,120 | 9/1978 | Dyer et al. | 427/88 X |
| 4,180,604 | 12/1979 | Feng et al. | 430/270 |
| 4,200,668 | 4/1980 | Segal et al. | 427/53.1 |

Primary Examiner—Evan K. Lawrence
Attorney, Agent, or Firm—Joel F. Spivak

[57] ABSTRACT

A method which is particularly suitable to the manufacture of printed circuit boards of high resolution comprises the steps of forming a photoresist pattern having an ink coating over a substrate and subsequently depositing a species catalytic to electroless plating on the exposed substrate surface and then forming a flash electroless deposit thereon. The ink coating is then removed together with any overlying deposit leaving the photoresist intact so as to prevent spreading of the deposited flash metal pattern during the subsequent step of full buildup electroless and/or electrolytic plating.

12 Claims, 7 Drawing Figures

PROCESS FOR IMPROVED WALL DEFINITION OF AN ADDITIVE PRINTED CIRCUIT

TECHNICAL FIELD

This invention relates to forming a metal pattern on the surface of a substrate. More particularly, the present invention relates to methods of forming metal patterns on insulating substrates particularly suitable for the manufacture of high resolution printed circuit boards.

BACKGROUND OF THE INVENTION

It is well known to apply an electroless metal plating to an insulating substrate, such as plastic, by depositing a noble metal, such as palladium, gold or platinum, as an initiator or catalyst for the electroless metal plating onto the surface of the insulating substrate, and then dipping the substrate into an electroless metal plating solution. It is also known to catalyze a surface with a non-noble metal catalytic layer, e.g., Cu, by reduction of a copper compound adsorbed on the surface.

Various techniques have been proposed to form a circuit on the insulating substrate by electroless metal plating for the manufacture of printed circuits on flexible or rigid substrates. Among the methods utilized for forming printed circuit boards is the method disclosed in U.S. Pat. No. 3,929,483 wherein a photoresist is laid down on a surface which is highly absorptive to silver salts. Such a surface is anodized aluminum. The photoresist on the surface is then exposed to light through a negative to obtain a desired circuit pattern. The portions not struck by light are removed by washing in a suitable solvent. This leaves a resist image on top of the surface where light exposure has taken place and no resist on the surface where the resist has been removed by washing with the solvent. Thereafter, the substrate is soaked in a concentrated solution of silver nitrate wherein the silver salt is held by the absorptive surface not coated by the resist. This silver salt is then reduced to metallic silver by treatment with a suitable reducing agent. The photoresist is then removed by treatment with an appropriate solvent leaving the desired silver image in the absorptive medium. This silver metal deposit acts as a catalyst for subsequent electroless plating. It should be noted that in accordance with the teachings of this patent, the silver nitrate is held only in those areas where the resist has been washed off and is not absorbed by and does not coat the photoresist layer which is left on the specimen. In essence, the resist layer acts as a poison for the deposition of the silver nitrate.

In another method used in the prior art, a pattern of resist is laid down on an insulating substrate. The entire surface, including both resist and exposed substrate areas, is treated and coated with a sensitizer and an activator, and then the entire surface is treated with a metal deposition solution. Metal deposits both on the substrate and on the resist-covered areas and the resist with its electrolessly deposited metal coating is later removed by means of a solvent to leave only the metal pattern on the substrate, removing the metal pattern that overlies the resist upon removal of the resist. In this method, because of the relatively heavy formation of metal over the resist area, the edges of the conductors have a tendency to be ragged and hence resolution is not as good as required for some uses.

Still another electroless deposition method involves first sensitizing and activating the entire substrate surface before putting down a resist pattern. Then, after putting down the resist pattern, the entire surface is treated with the electroless metal deposition solution. In this method, metal deposits only on the sensitized and activated exposed substrate areas and not on the resist-covered areas. Resolution is quite good in this method, however, this method has serious disadvantages, e.g., (1) in that sensitization and activation of the substrate surface produces a surface which may have a relatively low resistivity between the deposited conductors and if spacing is to be very close, as is required in many of today's applications, this may cause electrical breakdown, and (2) manufacturing handling problems in that the catalytic surface is highly sensitive to contamination, scratching and the like which can result in defective circuits.

More recently, a coworker has suggested a method of manufacturing a printed circuit board by a wholly additive process which results in a pattern of reasonably high resolution and does not result in unwanted lowering of the surface resistance on a substrate between pattern lines. That method comprises applying a removable negative mask onto a surface of the substrate whereby portions of the surface are exposed to form a positive circuit pattern, sensitizing the circuit pattern portions and the negative mask to form thereon a catalytic species capable of catalyzing an electroless metal deposition, removing the negative mask and thereby the catalytic species thereon to delineate the catalytic species and the circuit pattern on the surface and electrolessly depositing a metal onto the delineated catalytic species in the circuit pattern. A preferred variation of this method includes the step, after sensitization of the surface and before removing the mask, of applying a thin flash metal electroless plating of from 0.003 to 0.020 mils in thickness over the catalytic layer. After the formation of this flash plating, the mask is removed together with any catalyst and flash plate overlying it. Finally, the desired metal is then electrolessly deposited onto the remaining portions of the flash plate surface pattern. This flash metal deposit in accordance with that method results in a circuit image that is extremely stable and which can be stored indefinitely prior to electroless plating.

In the aforementioned process, as in many prior art processes, line resolution is limited by the spreading of the line width during buildup of the conductor. This spreading also makes manufacturing more difficult and may limit the line resolution achievable. I have now discovered a modification of this last mentioned process which not only retains the advantages of that process but further improves the resolution and wall definition of the final printed circuit pattern.

SUMMARY OF THE INVENTION

In accordance with the novel invention, a metal pattern is formed on an insulating substrate by the following steps:

(a) forming a mask over at least one major surface of the substrate to define a raised negative mask pattern of the desired metal pattern;

(b) applying a coating over the mask, the coating material covering only the mask and not the adjacent exposed substrate areas, said coating being strippable by a chemical treatment which does not substantially attack the underlying mask;

(c) depositing a species catalytic to electroless plating on the exposed substrate surface;

(d) chemically stripping the coating material and any overlying deposit while leaving the underlying mask intact; and (e) plating a metal to a desired thickness to form the desired metal pattern on the substrate.

In accordance with this novel method, improved resolution and wall definition of the metal pattern can be achieved due to the continued presence of the resist in the form of the negative of the pattern which prevents spreading of the pattern during full-build plating.

DETAILED DESCRIPTION

Figure 1A:
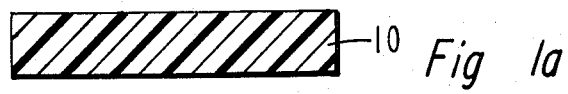
FIGS. 1a through 1g are cross-sectional, elevational views illustrating successive steps in making a printed circuit board in accordance with the method of the present invention.
Figure 1B:
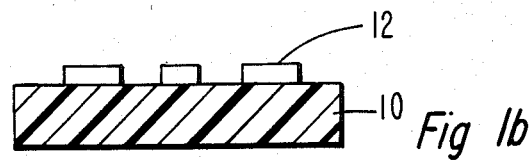
Figure 1C:
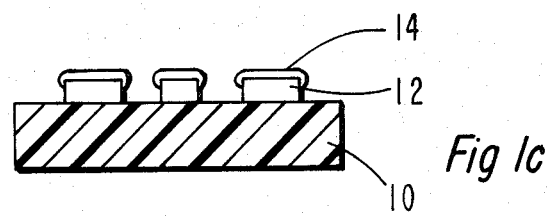
Figure 1D:
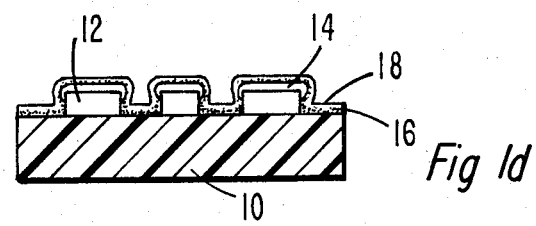
Figure 1E:
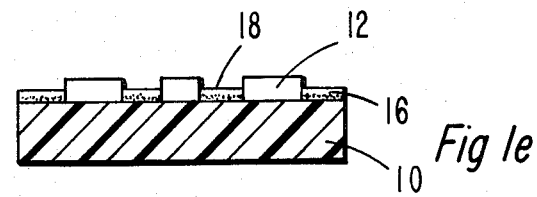
Figure 1F:
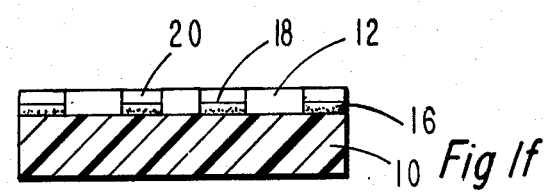
Figure 1G:
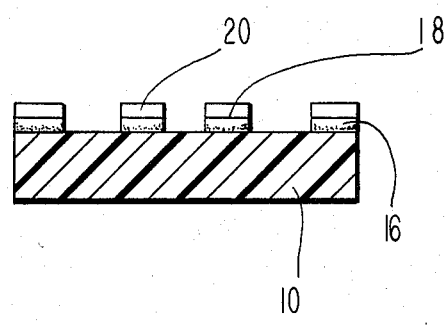

The process of the present invention can be employed for many applications where a patterned metal layer is to be applied to an insulating substrate. The invention will be illustrated in detail with reference to the manufacture of a printed wiring board. Such printed wiring board may be of the rigid or flexible type. Furthermore, the present invention will be discussed primarily in terms of selectively depositing copper on a surface of an insulating substrate. It should be apparent to one skilled in the art and readily appreciated that the inventive concept is equally applicable to depositing other suitable metals.

In accordance with the present invention, a negative mask is applied to a surface of a suitable substrate. Typically, the mask is of a photoresist type whereby portions of the substrate surface remain exposed in a positive circuit pattern while the remaining portions of the substrate is covered by the negative photoresist mask. Various masking materials and their methods of application are well known in the art and any of the known materials may be employed. The requirements for the mask is that it must be applied in a thickness, e.g., preferably about 0.3 mils or more, so as to form a sufficiently raised pattern such that a coating which is to be subsequently applied over the mask, e.g., by means of a roller, will coat only the mask and not the adjacent bare substrate. Also, the coating must be removable by a solvent or other chemical treatment which does not substantially attack the underlying mask.

Subsequent to application of the resist, it is preferred to treat the exposed substrate surfaces so as to form micropores therein, thereby enhancing the adhesion of the catalytic layer and copper layer to be formed over the surface. One method of formation of the micropores, when employing a polymeric substrate such as an epoxy or modified epoxy, is by treating the surface with chromic acid or with a combination of materials, e.g., dimethylformamide and then chromic acid so as to first swell and then etch the substrate surface. This technique is well known in the art. It should be understood that the step of forming such micropores may also be performed subsequent to the application of the coating layer over the resist as well as prior to applying the coating. However, it is preferred to swell-etch prior to application of the coating. The coating layer may be applied over the resist by means of a roller in a manner such that it only coats the resist material and does not flow onto the adjacent exposed substrate surface. Typically the coating is an ink and when swelling and etching is done subsequent to application of the coating the coating must be resistant to the swell-etch processing solutions. It is preferred, in addition to the requirement that the ink be soluble in a solvent which does not substantially attack the underlying mask, that the ink be hydrophobic in nature or otherwise relatively nonadherent to the catalytic layer. In this way, only a small amount, if any, of catalyst and hence flash-plating will be formed over the ink layer and the ink can be more easily removed without adversely affecting any adjacent catalyst or flash-plated metal.

The inks (or other coating material) may be either organic solvent strippable or alkali strippable. Similarly, the photoresist (or other mask material) may be strippable inorganic solvent or aqueous alkali solutions. The only requirement being that the stripper used to strip the coating does not substantially attack the underlying mask.

Commercially available inks and resists generally include several categories such as, poly vinyl cinnamates, natural or synthetic rubbers mixed with diazido cross-linking agents, cresol formaldehydes, polyacrylate esters and lacquers.

Suitable commercially available solvent strippable inks include MacDermid Company's Metex 9251 and Colonial Printing Ink Company's Colonial 6055. Suitable acqueous alkali solution strippable inks which are commercially available include Dynachem Corps. SR20 and Enthone Corps. UR460B as well as Colonial UV5055.

The preferred ink, when employing a photoresist mask comprising a dry film type photoresist, e.g., Du-Pont Riston 1215 or Dynachem CR is MacDermid's 9251 which is soluble in 1,1,1-trichloroethane. The developed photoresist is relatively insoluble in this solvent but is soluble in methylene chloride. Also preferred is Dynachem TO photoresist which is alkali soluble and may be employed with an ink which is not alkali soluble.

As indicated, subsequent to the formation of the ink layer over the negative resist mask the substrate is treated so as to catalyze the surface thereof. Thereafter, the substrate is preferably exposed to an electroless copper flash-plating solution so as to form a thin electroless copper coating at least over the exposed regions of the substrate. This coating is typically from 0.003 to 0.020 mils thick. As with the prior art process, this flash coat enhances the life of the catalytic layer for future full electroless plating. Essentially any of the well known and commercially available catalyzing solutions and flash electroless plating baths are suitable.

Subsequent to the flash coating, the substrate is treated in a solvent which removes the ink and any materials thereover, i.e., catalyst and/or flash-plated metal, if any. The substrate now is left with a positive pattern containing catalyst and flash metal plate and adjacent thereto is the negative mask which is relatively thick as compared with the positive flash-plated pattern. The substrate is then treated with a full build electroless plating solution so as to plate the desired thickness of metal for the circuit pattern (typically 1.3–1.4 mils). The walls of the remaining mask material act to confine the full build plating to within the specified areas between mask lines thus preventing spreading of the pattern and resulting in a well defined high resolution circuit pattern. If desired, after the desired thickness of electroless metal plating has been reached, one can further plate with an electroplating bath, or in the alternative, one can use an electroplating bath directly over the flash metal coating to provide the full buildup. Also, where desired, subsequent to the full plating thickness being formed, the negative mask material can be removed, e.g., by solvent stripping.

The process described above can best be seen with reference to FIGS. 1a through 1g wherein FIG. 1a shows a typical substrate 10; 1b shows the substrate 10 having a photoresist 12 applied thereover in the form of a negative of the desired circuit pattern; 1c shows the ink 14 applied over the photoresist 12; 1d shows the catalytic layer 16 and flash deposit 18 formed over the substrate primarily (i.e., more densely) in the area of the substrate which is not covered by the mask material; 1e shows the substrate 10 after removal of the ink 14 and any catalytic 16 or flash-plated 18 material overlying the ink 14 leaving only a flash-plated circuit pattern in the desired areas on the substrate surface together with adjacent photoresist 12; 1f indicates the substrate 12 after treatment so as to apply a full thick electroless metal deposit 20 over the flash-plated material 18; and finally, 1g shows the substrate after removal of the mask 12 so as to leave only the desired circuit pattern on the substrate.

The step of treating the substrate to form micropores thereon which is preferably accomplished between steps shown as 1b and 1c has not been shown in the drawing. Also the steps of rinsing, neutralizing and/or drying between various chemical treatments and bath treatments, as are well known in the art, have also not been specifically described. These rinsing and neutralizing steps are preferred so as to keep the chemicals from one bath from contaminating that of another bath.

EXAMPLE I

An epoxy-glass substrate is drilled to form through holes. The substrate is then scrubbed to remove any drilled debris and the surface is cleaned prior to screen printing or resist deposition. A photoresist such as DuPont Riston 1215 photoresist is applied to the surface of the substrate and then exposed to light through a mask to form a 0.5 sail thick resist image. The image is then developed with trichloroethane thereby removing the unexposed resist. The substrate is then treated with an 86% aqueous solution of dimethylformamide at 30° C. to swell the exposed substrate surface. The swelled surface is dried and then etched for 5 minutes with moderate stirring at about 50° C. in a solution containing 100–105 grams/liter $CrO_3$ in dilute sulfuric acid. The etched substrate is rinsed, neutralized in a solution of sodium metabisulfite, rinsed again, and treated with a 20 volume percent solution of hydrochloric acid for about one minute. A thin nonporous layer of MacDermid's Metex 9251 ink is then roller coated over the resist and baked to obtain minimum cure sufficient for handling. The substrate is then catalyzed using a commercially available, $SnCl_2$, $PdCl_2$, HCl solution such as MacDermid 9070 catalyst. The catalyzed surface is then rinsed first with water and then with about a one normal sodium hydroxide solution at 60° C. followed by a second water rinse. The ink is then stripped with 1,1,1-thichloroethane, dried to remove any excess solvent and then plated with copper to a thickness of about 1.4 mils by immersion in an electroless copper plating bath such as one comprising copper sulfate, formaldehyde, tetrasodium ethylenediamine tetraacetic acid and sodium hydroxide. A suitable electroless bath is marketed by MacDermid under the designation 9620. The plated substrate can then be rinsed and dried. The resist may then be stripped by treatment with methylene chloride.

EXAMPLE II

The substrate is treated in the same manner as set forth in Example I through the steps of catalyzing and rinsing with normal sodium hydroxide solution. Thereafter, the substrate is immersed in a flash electroless copper plate bath such as MacDermid 9085 or 9072–9073 to form a thin, porous electroless copper deposit which is approximately 0.010 mil in thickness. The ink is then stripped as set forth in Example I and the substrate rinsed. The substrate may then be dried and stored for later processing or may continue to be processed by placing it in an electroless plating bath such as MacDermid 9620 to achieve a full plate of approximately 1.35 mils thick copper plating. The substrate is then rinsed, treated with methylene chloride to remove the resist layer and dried.

EXAMPLE III

Essentially the same procedure as set forth in example II is followed except that Dynachem CR dry resist is employed in place of the Riston 1215 and the steps of swelling and etching are performed subsequent to application and drying of the roller coated ink layer but prior to catalyzation.

It is to be understood that the embodiments described herein are merely illustrative of the principles of the invention. Various modifications may be made thereto by persons skilled in the art which will embody the principles of the invention and fall within the spirit and scope thereof.

What is claimed is:

1. A process of forming a metal pattern on an insulating substrate comprising the steps of:
  (a) forming a mask over at least one major surface of the substrate to define a raised negative mask pattern of the desired metal pattern;
  (b) applying a coating over the mask, the coating material covering only the mask and not the adjacent exposed substrate areas, said coating being strippable by a chemical treatment which does not substantially attack the underlying mask;
  (c) depositing a species catalytic to electroless plating on the exposed substrate surface;
  (d) chemically stripping the coating material and any overlying deposit while leaving the underlying mask intact; and
  (e) plating a metal to a desired thickness to form the desired metal pattern on the substrate including at least a first plating step comprising electroless plating.

2. The method recited in claim 1, wherein said first plating step forms a thin flash electroless deposit subsequent to catalyzation of the substrate surface.

3. The method recited in claim 1, wherein the mask material is a photoresist.

4. The method recited in claim 1, wherein said first plating step forms a flash electroless deposit having a thickness of from 0.003 to 0.02 mils subsequent to catalyzation of the substrate and wherein the mask is a photoresist having a thickness of at least about 0.3 mils.

5. The process recited in claims 1, 2, or 4, including the step of forming micropores in the substrate surface prior to catalyzation and wherein the coating is resistant to processing liquids used in forming the micropores.

6. The process recited in claim 1, including the step of stripping the mask subsequent to the final metal plating.

7. A method of forming a printed wiring board on a glass reinforced epoxy substrate comprising the steps of:
   (a) applying a photoresist pattern over at least one major surface of the substrate to define a raised negative pattern of the desired circuit;
   (b) applying a coating over the photoresist in a manner so as to cover only the photoresist and not any of the adjacent exposed substrate areas, said coating being strippable by a chemical treatment which does not substantially attack the underlying photoresist and said coating being resistant to processing liquids used in the subsequent swelling and etching steps;
   (c) swelling the exposed substrate surface;
   (d) etching the exposed substrate surface so as to form micropores therein;
   (e) depositing a species catalytic to electroless plating on the exposed substrate surface;
   (f) depositing a thin flash electroless metal over the catalyzed areas;
   (g) chemically stripping the coating and any overlying deposit while leaving the underlying photoresist intact; and
   (h) plating a metal to a desired thickness to form the desired full thick metal pattern on the substrate.

8. The process recited in claim 7, wherein the steps of swelling and etching are performed by means of treatment with dimethylformamide and chromic acid, respectively.

9. The process recited in claim 7, wherein the coating is applied by means of a roller.

10. The process recited in claim 9, wherein the photoresist layer is at least about 0.3 mils thick.

11. The method recited in claim 7, wherein the final metal plating is performed in an electroless plating bath.

12. The process as recited in claim 11, including the step of stripping the photoresist subsequent to the final electroless plating.

* * * * *